United States Patent [19]
Ochi et al.

[11] Patent Number: 5,708,233
[45] Date of Patent: Jan. 13, 1998

[54] THERMOELECTRIC SEMICONDUCTOR MATERIAL

[75] Inventors: Yasuo Ochi; Kazuo Ohara, both of Sagamihara, Japan

[73] Assignee: Kabushiki Kaisha Ohara, Kanagawa, Japan

[21] Appl. No.: 688,014

[22] Filed: Jul. 29, 1996

Related U.S. Application Data

[63] Continuation-in-part of Ser. No. 387,074, Feb. 13, 1995, abandoned.

[30] Foreign Application Priority Data

Feb. 22, 1994 [JP] Japan ................. 6-024387
Dec. 29, 1994 [JP] Japan ................. 6-338893

[51] Int. Cl.$^6$ ........................... H01L 35/22
[52] U.S. Cl. ............. 136/238; 136/201; 136/239; 136/241; 252/62.3 T; 252/62.3 BT
[58] Field of Search ............ 136/201, 224, 136/236.1, 238, 239, 241; 252/62.3 T, 62.3 ZB, 62.3 ZT, 62.3 BT, 62.3 C

[56] References Cited

U.S. PATENT DOCUMENTS

| | | | |
|---|---|---|---|
| 3,379,577 | 4/1968 | Bird, Jr. | 136/205 |
| 4,010,291 | 3/1977 | Katsube et al. | 427/126 |
| 4,399,015 | 8/1983 | Endo et al. | 204/192 P |
| 4,470,898 | 9/1984 | Penneck et al. | 252/511 |
| 4,838,656 | 6/1989 | Stoddard | 350/336 |
| 4,938,244 | 7/1990 | Kumada et al. | 136/212 |
| 4,969,956 | 11/1990 | Kreider et al. | 136/201 |
| 5,180,476 | 1/1993 | Ishibashi et al. | 204/192.29 |
| 5,262,800 | 11/1993 | Smith et al. | 346/76 PH |
| 5,275,001 | 1/1994 | Yokotani et al. | 62/3.7 |

FOREIGN PATENT DOCUMENTS

| | | | |
|---|---|---|---|
| 56-98646 | 8/1981 | Japan | 252/62.3 ZT |
| 2 008 555 A | 6/1979 | United Kingdom | 252/62.3 BT |

OTHER PUBLICATIONS

M. Yust et al., *Electronics and Optics*, (1989), "Transparent Thin Film Thermocouple", vol. 176, No. 1, Lausanne, CH, pp. 73–78, XP87274.

*Journal of Materials Sciences 30*, (1995), "Low–Temperature Formation mechanism of *Double Oxides* $FE^xZr(Ti)_{1-0.75x}O_{2-\delta}$ prepared from alkoxides and acetylacetonates", pp. 1087–1094, M.V. Tsodekov et al.

Giulio Ottonello, "Energetic of Multiple Oxides with Spinel Structure", (1978), pp. 79–90.

*Primary Examiner*—Kathryn L. Gorgos
*Assistant Examiner*—Chrisman D. Carroll
*Attorney, Agent, or Firm*—Oliff & Berridge

[57] ABSTRACT

A thermoelectric semiconductor material is used for thermoelectric conversion in a thermoelectric conversion device. The material comprises a double oxide having one of a normal spinel crystal structure and an inverse spinel crystal structure, the double oxide comprising a composition that is represented by $MIn_2O_4$, wherein M represents a metal element that can be changed into a divalent ion.

18 Claims, 3 Drawing Sheets

SAMPLE NO.1 (MgIn2O4)

THERMOELECTRIC SEMICONDUCTOR MATERIAL

This is a continuation-in-part of U.S. application Ser. No. 08/387,074, filed Feb. 13, 1995, now abandoned.

BACKGROUND OF THE INVENTION

1. Field of the Invention

The invention is directed to a thermoelectric semiconductor material for use in a thermoelectric conversion device and method. In particular, the thermoelectric material is adapted for use in a thermoelectric device, such as a Peltier cooling element, an electric generating element, or the like. The device can exhibit a Peltier effect where a temperature difference is generated by using an electric energy or exhibit a Seebeck effect where an electric energy is generated by using a temperature difference.

2. Description of Related Art

Thermoelectric performance of a thermoelectric semiconductor material, which exhibits either a Peltier effect or Seebeck effect, is evaluated by the figure of merit Z (dimension: $K^{-1}$). The degree of merit Z is estimated by the following equation, where a larger value for the figure of merit Z indicates a better thermoelectric performance:

$$z = \alpha^2 \sigma / \kappa$$

where, $\alpha$ is a Seebeck coefficient ($\mu V/K$), $\sigma$ is an electrical conductivity ($(m\Omega)^{-1}$), and $\kappa$ is a thermal conductivity (W/mK). Therefore, to obtain a thermoelectric material having a high thermoelectric performance, it is desirable to select a material having a large Seebeck coefficient $\alpha$, a large electrical conductivity $\sigma$ and a small thermal conductivity $\kappa$.

Generally, a metal or semiconductor material is a thermoelectric material. Wiedemann Franz's law states that a ratio of the electrical conductivity $\sigma$ to thermal conductivity $\kappa$ at a temperature in a metal material does not depend upon the kind of metal, and therefore the ratio is constant in any kind of metal. Thus, there is little chance of obtaining a thermoelectric material having a high thermoelectric performance by selecting a specific kind of metal.

However, in semiconductor materials, the Wiedemann Franz law does not necessarily hold. It is possible to select a specific material having a large electrical conductivity $\sigma$ and a small thermal conductivity $\kappa$. Accordingly, there is a good chance of obtaining a thermoelectric material with a high thermoelectric performance because the Seebeck coefficient $\alpha$ value of a semiconductor material is usually about ten to several hundreds times that of a metal material. Therefore, various semiconductor materials have been developed as thermoelectric materials.

For example, transition silicide, which is used for thermoelectric power generation at a high temperature, and chalcogenide, which is used as a material for Peltier cooling, are representative thermoelectric semiconductor materials. In these materials, a chalcogenide material of the $Bi_2Te_3$ system, e.g., $Bi_2Te_3$, $Sb_2Te_3$, PbTe, GeTe or the like, usually presents the best thermoelectric performance near room temperature in a thermoelectric cooling device. This type of material has a high figure of merit Z greater than $10^{-3} K^{-1}$.

However, thermoelectric performance of the chalcogenide material of the $Bi_2Te_3$ system can be extremely reduced at lower and higher temperature ranges, other than at room temperature. In particular, because the value of the figure of merit Z is about $10^{-5} K^{-1}$ at a temperature greater than about 250° C., and oxidation and decomposition occur at a high temperature, it was not possible to satisfactorily use a chalcogenide material over a wide temperature range.

Semiconductor materials, other than the chalcogenide material of $Bi_2Te_3$ system, could be used as a thermoelectric material. However, these can be usable in only a very narrow temperature range as discussed.

SUMMARY OF THE INVENTION

The invention was developed to overcome the above-described problems. An object of the present invention is to provide a thermoelectric conversion device and thermoelectric conversion method using a suitable thermoelectric semiconductor material. The thermoelectric semiconductor material should present a good figure of merit Z in a wide temperature range, e.g., in the range of 100K (about −173° C.) to 1000K (about 727° C.). Further, the thermoelectric semiconductor material should be stably usable in a thermoelectric conversion.

In order to solve the above problems, it is preferable to consider the electrical conductivity of a solid that defines the performance of a Peltier element and the Seebeck coefficient determined by a material, which is in a crystal structure unit of the solid material and its structure thereof. In these crystal structures, the bond distance between cations, the coordinating angle, and the overlap of electron orbits are defined by the three-dimensional arrangement of oxygen ligends and the like.

Accordingly, the inventors studied crystal and electronic structures. As a result, the inventors discovered that a spinel structure is effective as a host of oxide crystals. The spinel structure is considered to be a rutile chain, such as a normal chain sharing an edge of an octahedron parallel to [110] having connected four-fold coordinating cations and having free electrons transmitted in a conduction band formed by the s-orbit of the central ion in an oxygen octahedron. In the following, it should be understood that the spinel structure includes both normal and inverse spinel crystal structures.

Furthermore, the inventors studied and researched spinel structure materials, which exhibited electrical conductivity. They discovered that a double oxide having a composition represented by $MIn_2O_4$, wherein M was an element which might change into a divalent ion, exhibited optimal characteristics as a thermoelectric material. The inventors discovered that Mg or Cd, by which a spinel crystal structure could be easily formed, was effective as M in $MIn_2O_4$.

Further, the inventors discovered that it was possible to control the concentration of free electrons or holes, which come to be carriers, by adding trace impurities into the host oxide crystal ($MIn_2O_4$). These substitute for another impurity having a different valence number for In or M that might change into a divalent ion in the host crystal. Consequently, the electrical conductivity and Seebeck coefficient of the material could be further improved.

The invention was developed on the basis of the above knowledge. In accordance with one aspect of the invention, the thermoelectric semiconductor material comprises a double oxide, which contains indium (In) and has a normal spinel crystal structure or an inverse spinel crystal structure. The thermoelectric semiconductor material may further contain at least one of magnesium (Mg) and cadmium (Cd).

The thermoelectric material may further contain 0.01–5.0 atomic % of at least one element selected from elements of groups Ia, IIa, IVa, Ib, IIIb, and IVb, in the second to the sixth periods of the periodic table. For example, zinc (Zn), gallium (Ga), germanium (Ge), tin (Sn), lead (Pb) and the like, may be a trace additive. The thermoelectric semiconductor material may further contain 0.01–5.0 atomic % of at least one element selected from 3d-transition elements, for example, iron (Fe), cobalt (Co), nickel (Ni) and the like, and rare earth elements, such as scandium (Sc), yttrium (Y), or elements of the lanthanoid series having atomic numbers 57–71, as a trace additive.

It is desirable that the concentrations of the trace additives be in the described range because of the influence of a changing concentration of the trace additives on the properties of the material. When the concentration is more than the upper limit or less than the lower limit, the specific resistance of the material increases. Thus, it is difficult to make a semiconductor material.

In order to obtain excellent electrical conductivity, it is preferable that the concentrations of the trace additives not be more than 1.0 atomic %, more preferably not more than 0.5 atomic %.

The thermoelectric material may contain both at least one element selected from elements of groups Ia, IIa, IVa, Ib, IIIb, and IVb, in the second to the sixth periods of the periodic table, for example, Zn, Ga, Ge, Sn, Pb and the like, and at least one element selected from 3d-transition elements and rare earth elements, as a trace additive.

The thermoelectric semiconductor material of the invention comprises a double oxide, which contains indium and has a normal spinel crystal structure or an inverse spinel crystal structure. The thermoelectric semiconductor material not only presents a large figure of merit Z near room temperature, but presents a large figure of merit Z with a good repeatability in the range of 100K to 1000K. The thermoelectric semiconductor material also has an excellent thermoelectric property and is stable over a wide temperature range.

When the double oxide contains at least one of magnesium and cadmium, the double oxide can be prepared by a sintering method. The sintering method does not require a specific atmosphere, and the temperature required for sintering the double oxide is relatively low, compared with sinterings of other ceramics. The temperature for the sintering method to make a thermoelectric semiconductor material in accordance with the invention is approximately 1000° C.–1500° C. Therefore, it is possible to easily form the material.

The thermoelectric semiconductor material of the invention contains at least one element selected from elements of groups Ia, IIa, IVa, Ib, IIIb, and IVb, in the second to the sixth periods of the periodic table, or at least one element selected from 3d-transition elements and rare earth elements, as a trace additive. Thus, the formed donor level or acceptor level makes it possible to control a concentration of free electrons or holes that become carriers. Accordingly, it is possible to control the electrical conductivity and Seebeck coefficient of the thermoelectric semiconductor material.

The thermoelectric conversion device can be formed as a π-shaped thermoelectric conversion device or a U-shaped thermoelectric conversion device. However, the thermoelectric conversion device is not limited to a π-shaped and U-shaped device. Any connection thermoelectric conversion device and method, which incorporates the principles of this invention, may use a thermoelectric semiconductor material as disclosed herein. For example, the thermoelectric conversion device may be formed as those in U.S. Pat. Nos. 4,969,956, 4,938,244 and 5,275,001, the contents of which are fully incorporated herein.

Other objects, advantages and salient features of the invention will become apparent from the following detailed description, which, taken in conjunction with the annexed drawing, discloses preferred embodiments of the invention.

BRIEF DESCRIPTION OF THE DRAWINGS

The invention will be described in detail with reference to the following drawings, in which like reference numerals refer to like element and wherein.

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
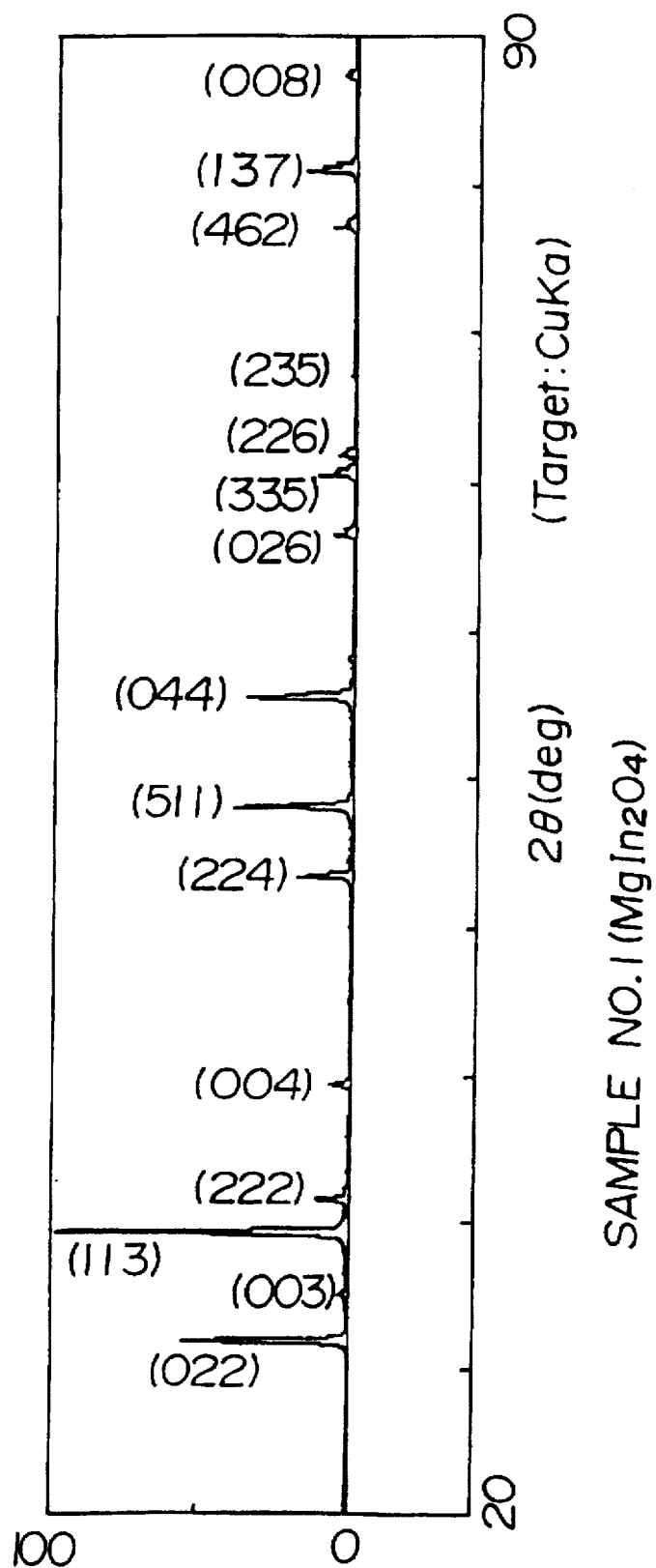
FIG. 1 is a view of an X-ray diffraction pattern of $MgIn_2O_4$.

Hereinafter, a semiconductor material adapted to use for thermoelectric conversion and a thermoelectrical converting method using the material will be described.

In the following embodiments, each sample of the thermoelectric semiconductor material was prepared by a sintering process. In the sintering process, a mixed powder comprising a predetermined raw powder material was pressed in a desired shape, such as a lump, to form a green compact. Thereafter, the green compact was sintered under atmospheric pressure.

First, 15 elements, i.e., magnesium (Mg), cadmium (Cd), calcium (Ca), strontium (Sr), barium (Ba), europium (Eu), chromium (Cr), manganese (Mn), iron (Fo), cobalt (Co), nickel (Ni), copper (Cu), zinc (Zn), tin (Sn), and lead (Pb), were selected as the elements M, which might change into a divalent ion, as shown in Table 1. With respect to each element M, an oxide (MO) thereof and oxide of indium ($In_2O_3$) were measured so as to have equal molar amounts. They were sufficiently mixed in a mortar to obtain each mixed powder including the element M.

TABLE 1

| SAMPLE NO. | DIVALENT ION M | IONIC RADIUS (Å) FOUR-FOLD COORDINATION | IONIC RADIUS (Å) SIX-FOLD COORDINATION | CRYSTAL STRUCTURE |
| --- | --- | --- | --- | --- |
| 1 | Mg | 0.57 | 0.72 | SPINEL STRUCTURE |
| 2 | Cd | 0.58 | 0.75 | SPINEL STRUCTURE |
| 3 | Ca |  | 1.00 | ORTHO RHOMBIC SYSTEM |

TABLE 1-continued

| SAMPLE NO. | DIVALENT ION M | IONIC RADIUS (Å) FOUR-FOLD COORDINATION | IONIC RADIUS (Å) SIX-FOLD COORDINATION | CRYSTAL STRUCTURE |
|---|---|---|---|---|
| 4 | Sr | | 1.18 | ORTHO RHOMBIC SYSTEM |
| 5 | Ba | | 1.35 | ORTHO RHOMBIC SYSTEM |
| 6 | Eu | | 1.17 | NOT SPINEL |
| 7 | Cr | | 0.73 | BIXBYTE STRUCTURE |
| 8 | Mn | 0.66 | 0.81 | BIXBYTE STRUCTURE |
| 9 | Fe | 0.63 | 0.78 | BIXBYTE STRUCTURE |
| 10 | Co | 0.58 | 0.75 | MIXED CRYSTAL CONTAINING BIXBYTE AS MAIN PHASE |
| 11 | Ni | 0.55 | 0.69 | BIXBYTE STRUCTURE |
| 12 | Cu | 0.57 | 0.73 | BIXBYTE STRUCTURE |
| 13 | Zn | 0.60 | 0.74 | BIXBYTE STRUCTURE |
| 14 | Sn | | | BIXBYTE STRUCTURE |
| 15 | Pb | 0.98 | 1.19 | NO SPINEL |
| | In (3+) | 0.62 | 0.80 | |

Each mixture is put in a cylindrical forming die, which had a diameter of approximately 20 mm. A uniaxial pressure of approximately 600 kg/cm$^2$ is applied to the mixture. As a result, 15 kinds of mixed powders are obtained.

Each mixed powder is held at a temperature of 1200° C., except for Fe or Cu, which were held at 850° C., and Cd, which is held at 850° C. Each mixed powder is held under an atmospheric pressure for about 5 hours. Thereafter, the mixtures is naturally cooled and calcined.

Each sintered body, which had been calcined, is then ground, and put into a forming die. They are pressed under a pressure of 800 kg/cm$^2$, and further compression-molded by an isostatic pressing under a pressure of 3 ton/cm$^2$. Each obtained molded body is then held at a temperature of 1500° C., except Fe and Cu, which are held at 1200° C. and Cd, which is held at 1020° C., under atmospheric pressure for 10 hours. They are then naturally cooled. Thereafter, each molded body is main calcined.

The crystal structure of each of the 15 kinds of samples are shown in Table 1. These crystal structures are presumed from the electric charge and ionic radius for each sample, according to Shannon's ionic radius data (R. D. Shannon et. al. Acta Cryst. B25, 925-946 (1969)), and values of the ionic radii in tetrahedral and octahedral coordination. In the Table 1, the values of the ionic radii in tetrahedral and octahedral coordination for In are also indicated.

Figure 2:
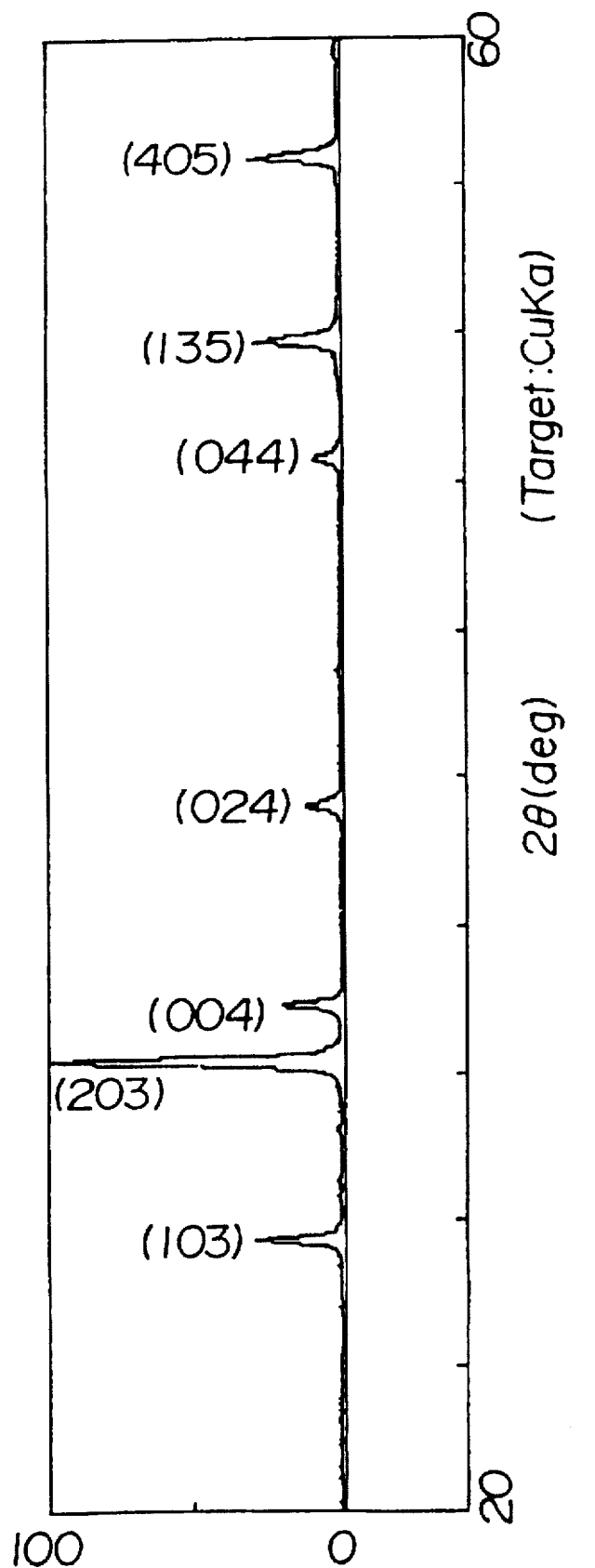
FIG. 2 is a view of an X-ray diffraction pattern of $CdIn_2O_4$.

As in Table 1, of the elements having spinel structures in 15 elements M, Mg (Sample No. 1) and Cd (Sample No. 2) might change into a divalent ion. To confirm, X-ray diffractions (XRD) were carried out for the Sample No. 1 (MgIn$_2$O$_4$) and Sample No. 2 (CdIn$_2$O$_4$). The structural analysis for the diffraction patterns are shown in FIGS. 1 and 2. Each sample is determined to have a cubic system. MgIn$_2$O$_4$ had an inverse spinel crystal structure with a crystal lattice constant of 8.865Å. CdIn$_2$O$_4$ had a normal spinel crystal structure with a crystal lattice constant of 9.160Å.

The Seebeck coefficient α, electrical conductivity σ, and thermal conductivity κ at room temperature are measured, for each of Sample No. 1 (MgIn$_2$O$_4$) and Sample No. 2 (CdIn$_2$O$_4$). The respective figures of merit Z are calculated on the basis of these values and shown in Table 2.

It was determined that for the 13 elements M other than Samples No. 1 and 2, the crystal structure is not spinel. Therefore, it was determined that it is not possible to obtain a crystal having a spinel structure and a good electrical conductivity for these materials using the above method. For example, a preparation under a sealed and depressurized atmosphere should be used to obtain a spinel crystal structure. Each of Samples Nos. 3–15 had a large electrical conductivity and small Seebeck coefficient, i.e., about 35 μV/K.

Indium oxide, magnesium oxide, and lead oxide in Sample No. 1 were measured. The In in MgIn$_2$O$_4$ of Sample No. 1 was replaced with Pb having a concentration of 0.25 atomic % (Sample No. 1-1); 0.50 atomic % (Sample No. 1-2); and 1.0 atomic % (Sample No. 1-3). Thereafter, these are sintered to obtain three samples with different lead concentrations under the same conditions as above. XRD was performed for each Sample 1-1 through 1-3.

It was determined that each crystal structure is spinel. As a result of a refinement in the lattice constant of each Sample 1-1 through 1-3, it was also determined that as amounts of substituted lead are increased, the lattice constant is increased and mixed lead ions are substituted for ions in the crystal lattice.

For Samples No. 1-1, 1-2, and 1-3, the Seebeck coefficient α, electrical conductivity σ, and thermal conductivity κ at room temperature are measured. The respective figures of merit Z are calculated based on these values, and shown in Table 3. In the Table 3, the figure of merit Z at room temperature for Sample No. 1 is also shown.

These samples have a high thermoelectric performance. The figure of merit Z is from ten to thirty times that of a sample without lead. A figure of merit Z in more than $10^{-3}K^{-1}$ is considered to be good.

For Sample No. 1-1 (lead concentration: 0.25 atomic %), the Seebeck coefficient α, electrical conductivity σ, and thermal conductivity κ at temperatures of 100K, 300K (about 27° C., i.e., room temperature), 400K (about 127° C.), 600K (about 327° C.), 800K (about 527° C.), 900K (about 627° C.), and 1000K (about 727° C.), were measured. The respective figures of merit Z were calculated based on the these values. These figures of merit are shown in Table 4. The sample has a figure of merit Z more than $10^{-3}K^{-1}$ and has a high thermoelectric performance over a wide temperature range of 100K–1000K. Further, a fluctuation in Sample 1-1 is narrow, as shown in Table 4.

TABLE 2

| SAMPLE NO. | | FIGURE OF MERIT Z (/K) |
|---|---|---|
| 1 | $MgIn_2O_4$ | $1.76 \times 10^{-4}$ |
| 2 | $CdIn_2O_4$ | $1.90 \times 10^{-4}$ |

TABLE 3

| SAMPLE NO. | LEAD CONCENTRATION (Atomic %) | FIGURE OF MERIT Z (/K) |
|---|---|---|
| 1 | 0.0 | $1.76 \times 10^{-4}$ |
| 1-1 | 0.25 | $3.32 \times 10^{-3}$ |
| 1-2 | 0.50 | $3.28 \times 10^{-4}$ |
| 1-3 | 1.00 | $5.76 \times 10^{-4}$ |

TABLE 4

| SAMPLE NO. | TEMPERATURE (K.) | FIGURE OF MERIT Z (/K) |
|---|---|---|
| 1-1 | 100 | $3.5 \times 10^{-3}$ |
| | 300 | $3.3 \times 10^{-3}$ |
| | 400 | $2.1 \times 10^{-3}$ |
| | 600 | $2.0 \times 10^{-3}$ |
| | 800 | $3.7 \times 10^{-3}$ |
| | 900 | $2.7 \times 10^{-3}$ |
| | 1000 | $1.5 \times 10^{-3}$ |

In a further test, the indium oxide, magnesium oxide, gallium oxide, germanium oxide, and lanthanum oxide in Sample No. 2 are measured. The Cd in $CdIn_2O_4$ of Sample No. 2 is replaced by Ga having concentrations of 1.0 atomic % (Sample No. 2-1) and 5.0 atomic % (Sample No. 2-2). Further, the Cd in $CdIn_2O_4$ is replaced by Ge having concentrations of 1.0 atomic % (Sample No. 2-3) and 5.0 atomic % (Sample No. 2-4). Also, the Cd is replaced by La having a concentration of 0.1 atomic % (Sample No. 2-5). These samples are sintered to obtain 5 samples each having different substituted atoms and a different concentration under the same conditions as above. XRD was performed for each Sample.

It was determined that each crystal structure is spinel. As a result of a refinement of the lattice constant, for each Sample, it was determined that as amounts of substituted atoms are increased, the lattice constant is increased and mixed substituted ions are substituted for ions in the crystal lattice structure.

For Samples No. 2-1, 2-2, 2-3, 2-4, and 2-5, the Seebeck coefficient α, electrical conductivity σ, and thermal conductivity κ at room temperature are measured. The respective figures of merit Z are calculated on the basis of these values, and shown in Table 5. In Table 5, the figure of merit Z at room temperature for Sample No. 2 is also shown.

Thus, by the addition of Ga, Ge, or La, these Samples have a high thermoelectric performance. The figure of merit Z is several times to ten times the figure of merit Z for a sample without such an additive, where greater than $10^{-3}K^{-1}$ is considered good.

For Sample No. 2-1 (Ga concentration: 1.0 atomic %), Sample No. 2-3 (Ge concentration: 1.0 atomic %), and Sample No. 2-5 (La concentration: 0.1 atomic %), the Seebeck coefficient α, electrical conductivity σ, and thermal conductivity κ at temperatures of 100K, 300K, 400K, 600K, 800K, 900K, and 1000K, were measured. The respective figures of merit Z were calculated based on these values, and are shown in Tables 6, 7, and 8.

TABLE 5

| SAMPLE NO. | SUBSTITUTIONAL ATOM | CONCENTRATION (Atomic %) | FIGURE OF MERIT Z (/K) |
|---|---|---|---|
| 2 | | 0.0 | $1.90 \times 10^{-4}$ |
| 2-1 | Ga | 1.0 | $3.2 \times 10^{-3}$ |
| 2-2 | | 5.0 | $1.5 \times 10^{-3}$ |
| 2-3 | Ge | 1.0 | $3.0 \times 10^{-3}$ |
| 2-4 | | 5.0 | $2.6 \times 10^{-3}$ |
| 2-5 | La | 0.1 | $2.4 \times 10^{-3}$ |

TABLE 6

| SAMPLE NO. | TEMPERATURE (K) | FIGURE OF MERIT Z (/K) |
|---|---|---|
| 2-1 | 100 | $3.3 \times 10^{-3}$ |
| | 300 | $3.2 \times 10^{-3}$ |
| | 400 | $2.8 \times 10^{-3}$ |
| | 600 | $2.8 \times 10^{-3}$ |
| | 800 | $2.9 \times 10^{-3}$ |
| | 900 | $3.0 \times 10^{-3}$ |
| | 1000 | $1.8 \times 10^{-3}$ |

TABLE 7

| SAMPLE NO. | TEMPERATURE (K) | FIGURE OF MERIT Z (/K) |
|---|---|---|
| 2-3 | 100 | $3.3 \times 10^{-3}$ |
| | 300 | $3.0 \times 10^{-3}$ |
| | 400 | $3.1 \times 10^{-3}$ |
| | 600 | $3.1 \times 10^{-3}$ |
| | 800 | $3.2 \times 10^{-3}$ |
| | 900 | $3.4 \times 10^{-3}$ |
| | 1000 | $2.2 \times 10^{-3}$ |

TABLE 8

| SAMPLE NO. | TEMPERATURE (K) | FIGURE OF MERIT Z (/K) |
|---|---|---|
| 2-5 | 100 | $3.5 \times 10^{-3}$ |
| | 300 | $2.4 \times 10^{-3}$ |
| | 400 | $2.5 \times 10^{-3}$ |
| | 600 | $2.6 \times 10^{-3}$ |
| | 800 | $3.0 \times 10^{-3}$ |
| | 900 | $3.4 \times 10^{-3}$ |
| | 1000 | $1.9 \times 10^{-3}$ |

Each sample has a figure of merit Z more than $10^{-3}K^{-1}$, and therefore has a high thermoelectric performance over a wide temperature range from 100K–1000K. Further, any fluctuation is narrow, as shown in Tables 6–8.

It should also be understood that the present invention is not limited to the features described therein. For example, the element M, which may change into a divalent ion, is not limited to Mg and Cd. The element M may be any element, which has an electrical conductivity and spinel crystal structure. Further, the trace additive is not limited to Pb, Ga, Ge, and La. It may be Zn, Sn, 3d-transition elements, rare earth elements other than La, or other such elements. Also, the concentration may be selected from the range of approximately 0.01–5.0 atomic %, so long as the figure of merit Z can be improved.

The thermoelectric semiconductor material of the invention may be prepared by methods other than a sintering method. For example, a physical or chemical vapor deposition, e.g., a sputtering method, or CVD method, liquid deposition including a sol-gel method, melting method, and the like, can be used to form the thermoelectric semiconductor material.

Although the thermoelectric semiconductor material of the present invention may be in a lump shape. For example, it may take any number of appropriate shapes. The thermoelectric semiconductor material may be formed, for example, as a shape of a thin film by a growth method. The thermoelectric semiconductor material of the invention has an excellent thermoelectric performance regardless of its shape.

The thermoelectric semiconductor material has a large figure of merit Z near the room temperature, because the thermoelectric semiconductor material of the invention comprises a double oxide and the double oxide contains indium and has either a normal spinel crystal structure or an inverse spinel crystal structure. The thermoelectric semiconductor material also has a large figure of merit Z with a good repeatability over a temperature range from 100K to 1000K. It also has an excellent stable thermoelectric property over a wide temperature range.

When the double oxide contains at least one of magnesium and cadmium, the double oxide can be prepared by a sintering method. Since the sintering method does not require a specific atmosphere and the temperature required for sintering the double oxide is relatively low compared to the sintering temperature for other ceramics, i.e., approximately 1000° C.–1500° C., it is possible to easily form a double oxide.

The thermoelectric material of the invention contains at least one element selected from elements of groups Ia, IIa, IVa, Ib, IIIb, and IVb, in the second to the sixth periods of the periodic table, or at least one element selected from 3d-transition elements, and rare earth elements, as a trace additive. Thus, an acceptable donor level or an acceptor level is formed, so it is possible to control the concentration of free electrons or holes which form carriers. Accordingly, it is possible to control the electrical conductivity and Seebeck coefficient of the thermoelectric semiconductor material.

Each of the above thermoelectric semiconductor conversion materials may be used in a thermoelectrical conversion process in a thermoelectric conversion device. The thermoelectric conversion device and thermoelectric conversion process using the thermoelectric semiconductor material may take any appropriate form, such as any known device and/or structure.

Figure 3:
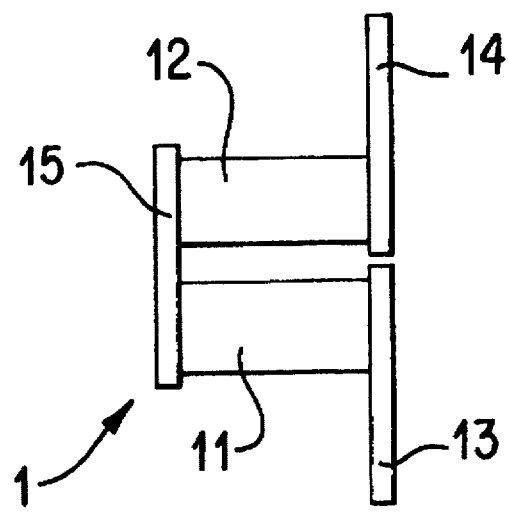
FIG. 3 is a schematic drawing of a π-shaped thermoelectric conversion device.
Figure 4:
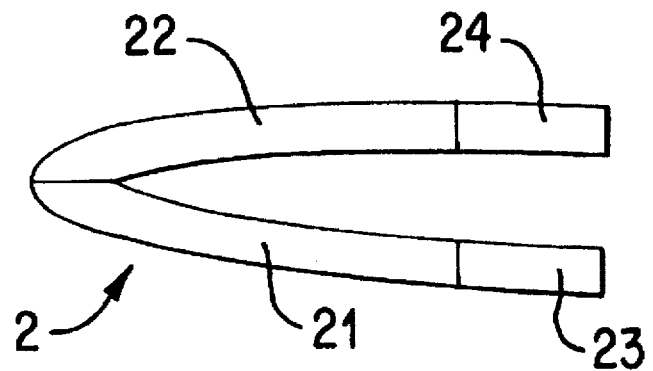
FIG. 4 is a schematic drawing of a U-shaped thermoelectric conversion device.

The thermoelectric semiconductor device may be a π-shaped thermoelectric conversion device as shown in FIG. 3. Alternatively, the thermoelectric semiconductor device may be a U-shaped thermoelectric conversion device as shown in FIG. 4. However, the thermoelectric conversion device is not limited to a π-shaped and U-shaped device. Any conventional thermoelectric conversion device and its method incorporating the principles of this invention may use the thermoelectric semiconductor material as disclosed. The thermoelectric device comprising at least a pair of p and n type of thermoelectric semiconductor members that are connected to each other at one end thereof and separated from each other at an other end, and at least a pair of separate electrodes mounted to the thermoelectric semiconductor members at the other end In FIG. 3, the π-shaped thermoelectric conversion device 1 comprises a bridge electrode 15 for connecting p and n type thermoelectric semiconductor members 11 and 12. Separate electrodes 13 and 14 are mounted respectively to the thermoelectric semiconductor members 11 and 12, to complete the thermoelectric conversion device.

The U-shaped thermoelectric conversion device 2 of FIG. 4 does not require a bridge electrode for connecting p and n types of thermoelectric semiconductor members 21 and 22 (as in the π-shaped device 1). In the U-shaped thermoelectric conversion device 2, thermoelectric semiconductor members 21 and 22 are directly connected to each other at an end of each. Separate electrodes 23 and 24 are mounted respectively to the thermoelectric semiconductor members 21 and 22, to complete the thermoelectric conversion device.

A thermoelectric conversion device according to the invention uses a thermoelectric semiconductor material as described above. The device may take any appropriate form, as long as thermoelectric conversion principles are met. A thermoelectric conversion device using the disclosed thermoelectric semiconductor material can exhibit structural characteristics of a Peltier effect; a Seebeck effect; an electric generator effect or other conventional thermocouple.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A thermoelectric converting method utilizing as a thermoelectric conversion material a material that comprises a double oxide having one of a normal spinel crystal structure and an inverse spinel crystal structure, said double oxide comprising a composition that is represented by $MIn_2O_4$, wherein M represents a metal element that can be changed into a divalent ion.

2. A method as claimed in claim 1, wherein the material consists essentially of the double oxide having one of the normal spinel crystal structure represented by $CdIn_2O_4$ and the inverse spinel crystal structure represented by $MgIn_2O_4$.

3. A method as claimed in claim 2, wherein the material further comprises 0.01–5.0 atomic % of at least one element selected from elements of groups Ia, IIa, IVa, IB, IIIb, and IVb, in the second to the sixth periods of the periodic table, as a trace additive.

4. A method as claimed in claim 3, wherein the material further comprises 0.01–5.0 atomic % of at least one element selected from 3d-transition elements and rare earth elements, as a trace additive.

5. A method as claimed in claim 2, wherein the material further comprises 0.01–5.0 atomic % of at least one element selected from 3d-transition elements and rare earth elements, as a trace additive.

6. A method as claimed in claim 1, wherein the material further contains 0.01–5.0 atomic % of at least one element selected from elements of groups Ia, IIa, IVa, Ib, IIIb, and IVb, in the second to the sixth periods of the periodic table, as a trace additive.

7. A method as claimed in claim 6, wherein the material further comprises 0.01–5.0 atomic % of at least one element selected from 3d-transition elements and rare earth elements, as a trace additive.

8. A method as claimed in claim 1, wherein the material further comprises 0.01–5.0 atomic % of at least one element selected from 3d-transition elements and rare earth elements, as a trace additive.

9. A method as claimed in claim 1, wherein the thermoelectric conversion is one of generating a temperature difference by using electric energy or generating electric energy by using a temperature difference.

10. A method as claimed in claim 1, wherein the step of utilizing comprises at least one of:

passing a first electric current through the material to heat one end of the material and cool another end of the material;

heating one end of the material to create a second electric current passing through the material; and cooling one end of the material to create a third electric current passing through the material.

11. A thermoelectric device comprising:

at least a pair of p and n type of thermoelectric semiconductor members which are connected to each other at one end thereof and separated from each other at another end; and at least a pair of separate electrodes mounted to the thermoelectric semiconductor members at the other end;

wherein at least one member of the at least one pair of thermoelectric semiconductor members comprises a double oxide having one of a normal spinel crystal structure and an inverse spinel crystal structure, said double oxide comprising a composition that is represented by $MIn_2O_4$, wherein M represents a metal element that can be changed into a divalent ion.

12. A thermoelectric device as claimed in claim 11, wherein the metal element is selected from the group consisting of magnesium and cadmium.

13. A thermoelectric device as claimed in claim 12, wherein the at least one member further contains 0.01–5.0 atomic % of at least one element selected from elements of groups Ia, IIa, IVa, Ib, IIIb, and IVb, in the second to the sixth periods of the periodic table, as a trace additive.

14. A thermoelectric device as claimed in claim 13, wherein the at least one member further contains 0.01–5.0 atomic % of at least one element selected from 3d-transition elements and rare earth elements, as a trace additive.

15. A thermoelectric device as claimed in claim 12, wherein the at least one member further contains 0.01–5.0 atomic % of at least one element selected from 3d-transition elements and rare earth elements, as a trace additive.

16. A thermoelectric device as claimed in claim 11, wherein the at least one member further contains 0.01–5.0 atomic % of at least one element selected from elements of groups Ia, IIa, IVa, Ib, IIIb, and IVb, in the second to the sixth periods of the periodic table, as a trace additive.

17. A thermoelectric device as claimed in claim 16, wherein the at least one member further contains 0.01–5.0 atomic % of at least one element selected from 3d-transition elements and rare earth elements, as a trace additive.

18. A thermoelectric device as claimed in claim 11, wherein the at least one member further contains 0.01–5.0 atomic % of at least one element selected from 3d-transition elements and rare earth elements, as a trace additive.

* * * * *